United States Patent
Isshiki et al.

(10) Patent No.: US 6,225,433 B1
(45) Date of Patent: *May 1, 2001

(54) CURABLE SILICONE COMPOSITION AND ELECTRONIC COMPONENTS

(75) Inventors: Minoru Isshiki; Katsutoshi Mine; Yoshiko Otani; Kimio Yamakawa, all of Chiba Prefecture (JP)

(73) Assignee: Dow Corning Toray Silicone Co., Ltd., Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 09/168,811

(22) Filed: Oct. 8, 1998

(30) Foreign Application Priority Data

Oct. 13, 1997 (JP) .................................................. 9-294911
Oct. 31, 1997 (JP) .................................................. 9-316001

(51) Int. Cl.⁷ .................................................. C08G 77/08
(52) U.S. Cl. .............................. 528/15; 528/43; 428/447; 156/329; 257/788; 257/789; 257/791; 257/753; 257/729
(58) Field of Search ........................ 528/15, 43; 156/329; 428/447; 257/729, 753, 788, 789, 791

(56) References Cited

U.S. PATENT DOCUMENTS

| | | | |
|---|---|---|---|
| 3,623,942 | * 11/1971 | Yerrick | 161/206 |
| 5,085,364 | * 2/1992 | Ishikawa et al. | 228/139 |
| 5,429,872 | * 7/1995 | Nakamura et al. | 428/391 |
| 5,571,853 | * 11/1996 | Ikeno et al. | 524/268 |
| 5,661,198 | * 8/1997 | Inatani et al. | 523/179 |

FOREIGN PATENT DOCUMENTS

| | | | |
|---|---|---|---|
| 0 195 355 A2 | 9/1986 | (EP) | C08G/77/04 |
| 0 727 462 A2 | 8/1996 | (EP) | C08L/83/04 |
| 3-157474 | 7/1991 | (JP) . | |
| 4-2624 | 1/1992 | (JP) . | |
| 7-192929 | 7/1995 | (JP) . | |

* cited by examiner

Primary Examiner—Margaret G. Moore
(74) Attorney, Agent, or Firm—Larry A. Milco

(57) ABSTRACT

A curable silicon composition, comprising (A) 100 parts by weight of an organopolysiloxane containing silicon-bonded aryl groups and at least two alkenyl groups per molecule, and having a viscosity of from 0.01 to 1,000 Pa.s at 25° C., wherein the aryl groups comprise from 1 to 40 mole % of the total silicon-bonded organic groups in the organopolysiloxane; (B) an organopolysiloxane having a viscosity of from 0.001 to 10 Pa.s at 25° C. and containing at least 2 silicon-bonded hydrogen atoms per molecule, in a quantity sufficient to cure the composition; (C) a platinum catalyst in a quantity sufficient to cure the composition; and (D) 0.00001 to 100 parts by weight of an organopolysiloxane having a viscosity of from 0.01 to 10,000 Pa.s at 25° C., with the proviso that when the organopolysiloxane contains aryl groups, the aryl groups comprise less than 1 mole % or more than 40 mole % of the total silicon-bonded organic groups in the organopolysiloxane, and wherein the organopolysiloxane cures to form a silicone having a complex modulus $\leq 1\times 10^8$ Pa at $-65°$ C. and a shear frequency of 10 Hz or a cured silicone having a Young's modulus $\leq 2.9\times 10^8$ Pa at $-65°$ C.

24 Claims, 1 Drawing Sheet

CURABLE SILICONE COMPOSITION AND ELECTRONIC COMPONENTS

FIELD OF THE INVENTION

This invention relates to curable silicone compositions and to electronic components. More particularly, this invention relates to a curable silicone composition that prior to its cure exhibits an excellent degassing behavior and cures to give cured silicone that has an excellent stress-relaxing capacity at low temperatures. The invention additionally relates to highly thermal shock-resistant electronic components that use the subject curable silicone composition.

BACKGROUND OF THE INVENTION

Platinum-catalyzed addition-curing silicone compositions are used as adhesives and sealant/filling agents for electronic components because they have the ability to cure rapidly upon heating or at room temperature with the formation of cured silicone gels or silicone rubbers that have excellent physical and electrical properties. Curable silicone compositions of this type can be exemplified as follows: the curable silicone composition for coating semiconductor elements taught in Japanese Patent Publication (Kokoku) Number Hei 4-2624 (2,624/1992) and comprising diorganovinylsilyl-endblocked dimethylsiloxane-methylphenylsiloxane copolymer, triorganosilyl-endblocked organohydrogenpolysiloxane, and a platinum catalyst; the adhesive taught in Japanese Patent Application Laid Open (Kokai or Unexamined) Number Hei 3-157474 (157,474/1991) and comprising organopolysiloxane containing at least 2 silicon-bonded alkenyl groups in each molecule, organopolysiloxane containing at least 2 silicon-bonded hydrogen atoms in each molecule, an organosilicon compound containing silicon-bonded alkoxy and silicon-bonded alkenyl or silicon-bonded hydrogen, and a platinum catalyst; and the molding material for electrical equipment taught by Japanese Patent Application Laid Open (Kokai or Unexamined) Number Hei 7-192929 (192,929/1995) that comprises vinyl-functional polyorganosiloxane, active hydrogen-containing organohydrogensiloxane, and curing catalyst and that cures to give a gel with a Young's modulus of $10^3$ to $10^5$ dyne/cm$^2$.

The existing curable silicone compositions have recently proven unable to satisfy the demands imposed by the miniaturization of electronic components and the desire for productivity improvements. Thus, while curable silicone compositions as taught in Japanese Patent Publication (Kokoku) Number Hei 4-2624 do provide cured silicone with an excellent stress-relaxing capacity at low temperatures, compositions of this type nevertheless have a very poor degassing behavior and as a result cannot support the highly efficient production of electronic components. In addition, the entrapped bubbles prevent substantial improvements in electronic component reliability. In the case of the cured silicone gels afforded by the cure of a curable silicone composition as taught in Japanese Patent Application Laid Open (Kokai or Unexamined) Number Hei 7-192929, these gels exhibit an excellent stress-relaxing capacity at ambient temperature, but at low temperatures suffer from a diminished stress-relaxing capacity and hence are unable to provide improvements in electronic component reliability.

SUMMARY OF THE INVENTION

The inventors achieved the present invention as a result of extensive research directed to solving the problems described above.

One object of the present invention is to provide a curable silicone composition that prior to its cure exhibits an excellent degassing behavior and that cures to give cured silicone that has an excellent stress-relaxing capacity at low temperatures. Another object of the present invention is to provide highly thermal shock-resistant electronic components that use the subject curable silicone composition.

The present invention is directed to a curable silicone composition, comprising:

(A) 100 parts by weight of an organopolysiloxane containing silicon-bonded aryl groups and at least two alkenyl groups per molecule, and having a viscosity of from 0.01 to 1,000 Pa.s at 25° C., wherein the aryl groups comprise from 1 to 40 mole % of the total silicon-bonded organic groups in the organopolysiloxane;

(B) an organopolysiloxane having a viscosity of from 0.001 to 10 Pa.s at 25° C. and containing at least 2 silicon-bonded hydrogen atoms per molecule, in a quantity sufficient to cure the composition;

(C) a platinum catalyst in a quantity sufficient to cure the composition; and (D) 0.00001 to 100 parts by weight of an organopolysiloxane having a viscosity of from 0.01 to 10,000 Pa.s at 25° C., with the proviso that when the organopolysiloxane contains aryl groups, the aryl groups comprise less than 1 mole % or more than 40 mole % of the total silicon-bonded organic groups in the organopolysiloxane, and wherein the organopolysiloxane cures to form a silicone having a complex modulus $\leq 1\times10^8$ Pa at -65° C. and a shear frequency of 10 Hz or a cured silicone having a Young's modulus $\leq 2.9\times10^8$ Pa at -65° C.

The present invention is also directed to an electronic component, comprising a semiconductor chip, a semiconductor chip attachment element bonded by an adhesive to the semiconductor chip, at least one member that electrically connects the semiconductor chip with the semiconductor chip attachment element, wherein at least a portion of the member is sealed or imbedded with a sealant/filling agent, and at least one of the adhesive and the sealant/filling agent is the curable silicone composition described above.

DETAILED DESCRIPTION OF THE INVENTION

Figure 1:
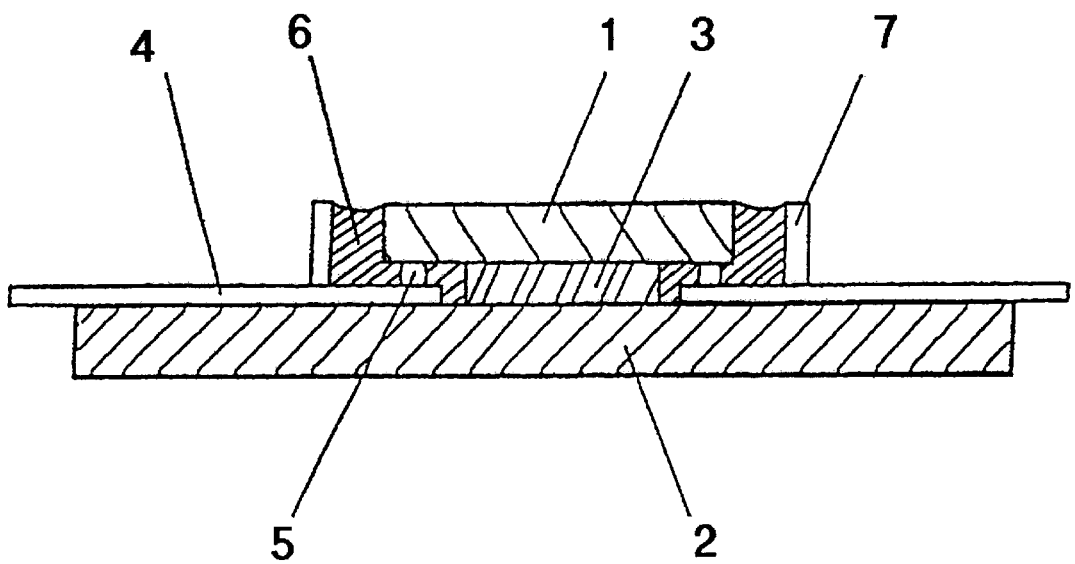
FIG. 1 contains the cross section of an IC that is one example of an electronic component according to the present invention.

The curable silicone composition according to the present invention will be explained in detail first. Component (A) is an organopolysiloxane containing silicon-bonded aryl groups and having a viscosity at 25° C. of 0.01 to 1,000 Pa.s. The aryl groups must comprise from 1 to 40 mole % of the total silicon-bonded organic groups in this organopolysiloxane, and each molecule of the organopolysiloxane must also contain at least 2 alkenyl groups. The viscosity of component (A) at 25° C. must be within the above-specified range: the cured silicone obtained at viscosities below the given lower limit has a poor mechanical strength, while the curable silicone composition obtained at viscosities above the given upper limit has poor handling properties. The silicon-bonded organic groups in component (A) are exemplified by substituted and unsubstituted monovalent hydrocarbon groups, e.g., alkyl groups such as methyl, ethyl, propyl, butyl, and so forth; alkenyl groups such as vinyl, allyl, butenyl, pentenyl, hexenyl, and so forth; aryl groups such as phenyl, tolyl, xylyl, and so forth; and halogenated alkyl groups such as 3,3,3-trifluoropropyl, and so forth. The aryl group must comprise from 1 to 40 mole % and preferably comprises from 1 to 25 mole % of the total of these organic groups. The molecular structure of the subject component (A) is exemplified by straight-chain, partially branched straight-chain, branched-chain, cyclic, and resin structures. A straight-chain molecular structure is preferred for the purpose of forming a cured silicone gel or cured silicone rubber.

The organopolysiloxane (B) is the crosslinker for the composition under consideration. It must have a viscosity at 25° C. from 0.001 to 10 Pa.s and must contain at least 2 silicon-bonded hydrogen atoms in each molecule. The viscosity of component (B) at 25° C. must be within the above-specified range: the cured silicone obtained at viscosities below the given lower limit has a poor mechanical strength, while the curable silicone composition obtained at viscosities above the given upper limit has poor handling properties. The silicon-bonded organic groups in component (B) are exemplified by substituted and unsubstituted monovalent hydrocarbon groups, e.g., alkyl groups such as methyl, ethyl, propyl, butyl, and so forth; aryl groups such as phenyl, tolyl, xylyl, and so forth; and halogenated alkyl groups such as 3,3,3-trifluoropropyl, and so forth. The molecular structure of the subject component (B) is exemplified by straight-chain, partially branched straight-chain, branched-chain, cyclic, and resin structures.

Component (B) is added to the composition under consideration in a quantity sufficient to cure the composition. For example, when the organopolysiloxane (D) lacks alkenyl, component (B) is preferably added in a quantity that provides from 0.3 to 10 moles silicon-bonded hydrogen in component (B) per 1 mole alkenyl in component (A). When the organopolysiloxane (D) does contain alkenyl, component (B) is preferably added in a quantity that provides from 0.3 to 10 moles silicon-bonded hydrogen in component (B) per 1 mole of the total alkenyl in components (A) and (D). The obtained composition will exhibit a progressively unsatisfactory cure as the amount of SiH from component (B) declines below 0.3 mole per 1 mole alkenyl in component (A) or total alkenyl in components (A) and (D). The ultimately obtained cured silicone has an increasingly poor mechanical strength as the amount of SiH from component (B) increases above 10 moles per 1 mole alkenyl in component (A) or total alkenyl in components (A) and (D).

The platinum catalyst (C) is a catalyst of the addition reaction-based cure of the instant composition. The catalyst (C) is exemplified by platinum black, platinum supported on silica micropowder, platinum supported on activated carbon, platinum supported on alumina powder, chloroplatinic acid, alcohol solutions of chloroplatinic acid, platinum-olefin complexes, platinum-alkenylsiloxane complexes, and thermoplastic resin powder (particle size $\leq 10$ μm) containing platinum catalyst as listed in the preceding. The thermoplastic resin used for such platinum catalyst-loaded thermoplastic resin powders is exemplified by polystyrene resins, nylon resins, polycarbonate resins, silicone resins, and the like.

Component (C) is added to the instant composition in a quantity sufficient to cure the composition. In specific terms, component (C) is preferably added in an amount that provides from 1 to 1,000 weight-ppm platinum metal in component (C) based on the total amount of components (A), (B), and (D).

The organopolysiloxane (D) is added in order to improve the degassing behavior of the instant composition without impairing the low-temperature stress-relaxing capacity of the cured silicone afforded by the cure of the composition. The viscosity of component (D) at 25° C. should be within the range from 0.01 to 10,000 Pa.s. At below the specified lower limit one encounters such problems as a decline in the degassing behavior of the corresponding curable silicone composition and a poor mechanical strength in the ultimately obtained cured silicone. At above the specified upper limit one encounters such problems as poor handling properties and an impaired degassing behavior in the corresponding curable silicone composition. The silicon-bonded organic groups in component (D) are exemplified by substituted and unsubstituted monovalent hydrocarbon groups, e.g., by alkyl groups such as methyl, ethyl, propyl, butyl, and so forth; alkenyl groups such as vinyl, allyl, butenyl, pentenyl, hexenyl, and so forth; aryl groups such as phenyl, tolyl, xylyl, and so forth; and halogenated alkyl groups such as 3,3,3-trifluoropropyl, and so forth. In the case of component (D), the aryl group must comprise less than 1 mole % or more than 40 mole % of the total of these organic groups. An organopolysiloxane (D) in which aryl comprises from 1 to 40 mole % of the total silicon-bonded organic groups will be compatible with component (A), which will make it impossible to obtain improvement in the degassing behavior of the corresponding curable silicone composition. Alkenyl may be bonded to the silicon in component (D) and in fact at least 2 alkenyl groups are preferably present in each molecule based on such considerations as outmigration from the cured silicone. The molecular structure of the subject component (D) is exemplified by straight-chain, partially branched straight-chain, branched-chain, cyclic, and resin structures. Straight-chain and branched-chain structures are preferred for the good degassing behavior they confer on the composition under consideration.

Component (D) must be added to the composition under consideration within the range from 0.00001 to 100 weight parts, preferably from 0.0001 to 50 weight parts, more preferably from 0.001 to 50 weight parts, and particularly preferably from 0.005 to 50 weight parts, in each case per 100 weight parts component (A). The curable silicone composition will exhibit a progressive deterioration in degassing behavior as the addition of component (D) declines below the specified lower limit, while exceeding the specified upper limit leads to a progressive decline in the low-temperature stress-relaxing capacity of the cured silicone afforded by the cure of the corresponding curable silicone composition.

An addition-reaction inhibitor may be added to the composition under consideration in order to improve its handling properties. This addition-reaction inhibitor is exemplified by alkyne alcohols such as 3-methyl-1-butyn-3-ol, 3,5-dimethyl-1-hexyn-3-ol, 3-phenyl-1-butyn-3-ol, and the like; ene-yne compounds such as 3-methyl-3-penten-1-yne, 3,5-dimethyl-3-hexen-1-yne, and the like; 1,3,5,7-tetramethyl-1,3,5,7-tetravinylcyclotetrasiloxane; 1,3,5,7-tetramethyl-1,3,5,7-tetrahexenylcyclotetrasiloxane; benzotriazole; and so forth. The addition-reaction inhibitor is preferably added at from 10 to 50,000 weight-ppm based on the total amount of components (A) and (B).

The instant composition may also contain other optional components such as adhesion promoters; heat stabilizers; flame retardants; colorants; electrically conductive fillers; thermally conductive fillers; thixotropy-conferring additives; solvents; inorganic fillers, e.g., fumed silica, precipitated silica, crystalline silica, fumed titanium oxide, alumina, titanium oxide, glass, silicon nitride, silicon carbide, silicon nitride, silver, nickel, and copper; and the inorganic fillers afforded by treating the surface of an inorganic filler as listed above with organoalkoxysilane (e.g., methyltrimethoxysilane, vinyltrimethoxysilane, 3-glycidoxypropyltrimethoxysilane, 2-(3,4-epoxycyclohexyl)ethyltrimethoxysilane, 3-methacryloxypropyltrimethoxysilane, 3-aminopropyltriethoxysilane, and N-(2-aminoethyl)-3-aminopropyltrimethoxysilane), organochlorosilane (e.g., methyltrichlorosilane, dimethyldichlorosilane, and trimethylchlorosilane), silazane (e.g., 1,1,1,3,3,3-hexamethyldisilazane and 1,1,3,3,5,5-hexamethylcyclotrisilazane), or organosiloxane oligomer (e.g., silanol-endblocked dimethylsiloxane oligomer, silanol-endblocked methylvinylsiloxane oligomer, and silanol-endblocked methylphenylsiloxane oligomer).

The cure of the composition comprising the components described hereinabove should give cured silicone with a complex modulus $\leq 1\times 10^8$ Pa, preferably from $1\times 10^8$ Pa to $1\times 10^2$ Pa, and particularly preferably from $1\times 10^7$ Pa to $1\times 10^2$ Pa, in each case at $-65°$ C. and a shear frequency of 10 Hz, or cured silicone with a Young's modulus $\leq 2.9\times 10^8$ Pa, preferably from $2.9\times 10^8$ Pa to 98 Pa, and particularly preferably from $2.9\times 10^8$ Pa to $9.8\times 10^3$ Pa, in each case at $-65°$ C. In a particularly preferred embodiment of the instant composition, its cure provides cured silicone with a complex modulus $\leq 1\times 10^8$ Pa ($-65°$ C., shear frequency=10 Hz) and a Young's modulus $\leq 2.9\times 10^8$ Pa ($-65°$ C.). An excellent low-temperature stress-relaxing capacity cannot be obtained when the curable silicone composition forms cured silicone with a complex modulus exceeding the specified upper limit at $-65°$ C. and a 10 Hz shear frequency or forms cured silicone with a Young's modulus exceeding the specified upper limit at $-65°$ C. And when such a curable silicone composition is used as an adhesive or sealant/filling agent in electronic component fabrication, the resulting electronic component will have an unsatisfactory thermal shock resistance. On the other hand, while a curable silicone composition that forms cured silicone with a complex modulus ($-65°$ C., 10 Hz shear frequency) below the specified lower limit or cured silicone with a Young's modulus ($-65°$ C.) below the specified lower limit does provide an excellent low-temperature stress-relaxing capacity, such a composition also has a low mechanical strength, and its use as an adhesive or sealant/filling agent in electronic component fabrication results in a tendency for the reliability of the resulting electronic component to decline. The complex modulus at $-65°$ C. and a shear frequency of 10 Hz and the Young's modulus at $-65°$ C. of the cured silicone under discussion can be determined by measurement using a dynamic viscoelasticity test instrument or tensile tester on strip or disk specimens.

The electronic component according to the present invention will now be explained in greater detail below. The electronic component according to the present invention comprises electronic components in which a semiconductor chip is bonded by an adhesive to a chip attachment element and at least a portion of the member that electrically connects said chip with the interconnects on said chip attachment element is sealed or embedded with a sealant/filling agent. The electronic component according to the present invention can be exemplified by integrated circuits, large-scale integrated circuits, and very large-scale integrated circuits. An example of the electronic component under consideration is displayed in FIG. 1, and the electronic component according to the present invention will be explained in greater detail with reference to this figure.

In the electronic component shown in FIG. 1, a semiconductor chip 1 has been face-to-face bonded to a semiconductor chip attachment element 2 (the "circuit substrate" in the figure) using an adhesive 3. Interconnects 4 have been formed on the surface of the semiconductor chip attachment element 2 facing the semiconductor chip 1, and these interconnects 4 and the semiconductor chip 1 have been electrically connected by the bumps 5. A portion or all of the bump 5 has been sealed or embedded with a sealant/filling agent 6. Leads that electrically connect to the interconnects 4 have been provided for the electronic component shown in FIG. 1 in order to mount this electronic component on a substrate. Although not shown in FIG. 1, the semiconductor chip 1 may be sealed with a resin sealant.

Neither the semiconductor chip nor the semiconductor chip attachment element are critical for the electronic component according to the present invention. The subject semiconductor chip attachment element can be made of, for example, a ceramic such as alumina, glass, and the like; an organic resin such as epoxy resin, glass fiber-reinforced epoxy resin, polyimide resin, bismaleimide triazine resin, and the like; or a metal such as stainless steel, copper, and the like. This element can be, for example, a rigid circuit substrate or chip carrier or a flexible circuit substrate or chip carrier. The interconnects can be formed on the surface of or within the semiconductor chip attachment element by such means as printing, vapor deposition, gluing, lamination, plating, and the like. In addition, outer connection terminals, such as a ball grid of solder balls or a pin grid, and other electrical elements and electrical components may also be mounted or provided. Bonding wires, leads, and bumps are examples of the member that electrically connects the semiconductor chip with the interconnects on its semiconductor chip attachment element. In order to relax the stresses acting on this member when the electronic component is subjected to thermal stresses, the use is preferred for this member of curved, bent, or flexed bonding wires or leads, or of bumps made of material with a low Young's modulus.

The electronic component according to the present invention is characterized in that the adhesive that bonds the semiconductor chip to the chip attachment element and/or the sealant/filling agent that seals or embeds the member that electrically connects the semiconductor chip and the interconnects on the chip attachment element is a curable silicone composition that affords cured silicone with a complex modulus less than or equal to $1\times 10^8$ Pa, preferably from $1\times 10^8$ Pa to $1\times 10^2$ Pa, and particularly preferably from $1\times 10^7$ Pa to $1\times 10^2$ Pa, in each case at $-65°$ C. and a shear frequency of 10 Hz, or cured silicone with a Young's modulus less than or equal to $2.9\times 10^8$ Pa, preferably from $2.9\times 10^8$ Pa to 98 Pa, and particularly preferably from $2.9\times 10^8$ Pa to $9.8\times 10^3$ Pa, in each case at $-65°$ C. The reason for specifying these ranges is that a reduced resistance to thermal shock occurs when the adhesive and/or sealant/filling agent used for electronic component fabrication is a curable silicone composition that forms cured silicone with a complex modulus exceeding the specified upper limit at $-65°$ C. and a shear frequency of 10 Hz or cured silicone with a Young's modulus exceeding the specified upper limit at $-65°$ C. When an electronic component fabricated using such an adhesive and/or sealant/filling agent is subjected to thermal shock, the stresses generated by expansion and contraction due to differences in the thermal expansion coefficients among the semiconductor chip, its attachment element, and other structural members ultimately cause deformation and debonding of the member electrically connecting the semiconductor chip with the interconnects on its attachment element as well as warpage, deformation, and cracking of the semiconductor chip and hence in the reduced resistance to thermal shock. On the other hand, an excellent low-temperature stress-relaxing capacity is obtained from a curable silicone composition that forms cured silicone having a complex modulus (−65° C., 10 Hz shear frequency) below the specified lower limit or cured silicone having a Young's modulus (−65° C.) below the specified lower limit. However, such a composition also provides a low mechanical strength and as a consequence tends to cause a reduced component reliability when employed as the adhesive or sealant/filling agent in electronic component fabrication.

The process for fabricating electronic components according to the present invention is not a critical consideration. The electronic component shown in FIG. 1 can be fabricated, for example, as follows. The semiconductor chip 1 is first attached face-to-face on the semiconductor chip attachment element 2 using an adhesive composition and this adhesive composition is then cured. The interconnects 4 on the semiconductor chip attachment element 2 are subsequently electrically connected by the bumps 5 to the semiconductor chip 1. This connection may also be carried out prior to the aforementioned cure of the adhesive composition. A portion or all of the bump 5 is thereafter sealed or embedded with a sealant/filling agent composition and the sealant/filling agent composition is cured. The bumps 5 that electrically connect the semiconductor chip 1 to the interconnects 4 on the chip attachment element 2 can be sealed or embedded by the above-described curable silicone composition by, for example, heating the curable silicone composition with a hot gas current or heat rays. A frame 7 may be provided in order to prevent outflow of the sealant/filling agent and at the same time protect the semiconductor chip 1 from external forces. The adhesive is preferably bonded to or in intimate contact with the sealant/filling agent in the electronic component according to the present invention. The sealant/filling agent is also preferably bonded to or in intimate contact with the bump 5 that electrically connects semiconductor chip 1 and the interconnects 4 on the semiconductor chip attachment element 2.

EXAMPLES

The curable silicone composition and electronic component according to the present invention will be explained below in greater detail through working examples. The viscosity values reported in the examples were measured at 25° C. using a rotational viscometer with a single-cylinder geometry.

Degassing Behavior of the Curable Silicone Compositions

The curable silicone composition was first stirred at 200 rpm for 5 minutes with a blade stirrer and was then degassed at 5 mmHg for 5 minutes. The degassing behavior of the curable silicone composition during this process was visually inspected.

Electronic Component Fabrication and Degassing Behavior of the Curable Silicone Compositions A semiconductor chip 1 was aligned and affixed face down on a region on a semiconductor chip attachment element 2 that had been coated with adhesive 3 by screen printing and the adhesive 3 was cured by heating at 150° C. for 30 minutes. Bumps 5 electrically connected to the interconnects 4 on the semiconductor chip attachment element 2 were connected to bonding pads on the semiconductor chip 1. A prescribed amount of a sealant/filling agent 6 was then applied from a dispenser into the volume encompassed by the semiconductor chip 1, the semiconductor chip attachment element 2, the adhesive 3, and the frame 7, and vacuum impregnation was run at 10 torr in order to carry out sealing/embedding with sealant/filling agent 6 without entrapping air bubbles throughout the entire volume encompassing the bumps 5. The degassing behavior of the curable silicone composition used as the sealant/filling agent was monitored during this process. The sealant/filling agent 6 was then cured by heating at 150° C. for 30 minutes. Twenty electronic components were fabricated by the described method.

Reliability Testing of the Electronic Components

The electronic components were subjected to thermal cycle testing (1,000 and 3,000 cycles, one cycle=30 minutes at −65° C. and 30 minutes at +150° C. ), after which electrical continuity testing was run using the ends of the interconnects 4. The defect percentage was determined based on the number of electronic components with continuity defects.

Example 1

A curable silicone composition with a viscosity of 20 Pa.s was prepared by mixing the following to homogeneity:

(A) 45.0 weight parts dimethylvinylsiloxy-endblocked dimethylsiloxane-methylphenylsiloxane copolymer with a viscosity of 2 Pa.s, a vinyl content of 0.24 weight %, and a phenyl group content constituting 4.5 mole % of the total silicon-bonded organic groups;

(B) 4.0 weight parts trimethylsiloxy-endblocked dimethylsiloxane-methylhydrogensiloxane copolymer with a viscosity of 0.005 Pa.s and a silicon-bonded hydrogen content of 0.7 weight %;

(C) 0.1 weight part 1 weight % isopropanolic chloroplatinic acid solution;

(D) 10.0 weight parts dimethylvinylsiloxy-endblocked dimethylpolysiloxane with a viscosity of 20 Pa.s and a vinyl content of 0.1 weight %; and as optional components, 0.01 weight part addition-reaction inhibitor (3-phenyl-1-butyn-3-ol); 1.0 weight part adhesion promoter consisting of a 1:1 (weight ratio) mixture of 3-glycidoxypropyltrimethoxysilane and dimethylhydroxysiloxy-endblocked methylvinylpolysiloxane with a viscosity of 0.04 Pa.s; and 40 weight parts inorganic filler (silica micropowder with an average particle size of 1.0 μm).

Heating this curable silicone composition at 150° C. for 30 minutes gave a silicone rubber with a JIS A durometer of 40 at room temperature. This silicone rubber had a complex modulus at −65° C. and a 10 Hz shear frequency of $2 \times 10^6$ Pa and a Young's modulus at −65° C. of $5.4 \times 10^6$ Pa.

Electronic components as shown in FIG. 1 were fabricated using this curable silicone composition as the adhesive and sealant/filling agent. Table 1 reports the results from the evaluation of the degassing behavior of the curable silicone composition and the thermal shock resistance of the electronic components.

Comparative Example 1

A curable silicone composition with a viscosity of 20 Pa.s was prepared by mixing the following to homogeneity:

(A) 45.0 weight parts dimethylvinylsiloxy-endblocked dimethylpolysiloxane with a viscosity of 2 Pa.s (vinyl content=0.24 weight %) instead of component (A);

(B) 4.0 weight parts trimethylsiloxy-endblocked dimethylsiloxane-methylhydrogensiloxane copolymer with a viscosity of 0.005 Pa.s and a silicon-bonded hydrogen content of 0.7 weight %;

(C) 0.1 weight part 1 weight % isopropanolic chloroplatinic acid solution;

(D) 10.0 weight parts dimethylvinylsiloxy-endblocked dimethylpolysiloxane with a viscosity of 20 Pa.s and a vinyl content of 0.1 weight %; and as optional components, 0.01 weight part addition-reaction inhibitor (3-phenyl-1-butyn-3-ol); 1.0 weight part adhesion promoter consisting of a 1:1 (weight ratio) mixture of 3-glycidoxypropyltrimethoxysilane and dimethylhydroxysiloxy-endblocked methylvinylpolysiloxane with a viscosity of 0.04 Pa.s; and 40 weight parts inorganic filler (silica micropowder with an average particle size of 1.0 μm).

Heating this curable silicone composition at 150° C. for 30 minutes gave a silicone rubber with a JIS A durometer of 40 at room temperature. This silicone rubber had a complex modulus at −65° C. and a 10 Hz shear frequency of $1.5 \times 10^8$ Pa and a Young's modulus at −65° C. of $3.9 \times 10^8$ Pa.

Electronic components as shown in FIG. 1 were fabricated using this curable silicone composition as the adhesive and sealant/filling agent. Table 1 reports the results from the evaluation of the degassing behavior of the curable silicone composition and the thermal shock resistance of the electronic components.

Example 2

A curable silicone composition with a viscosity of 12 Pa.s was prepared by mixing the following to homogeneity:

(A) 45.0 weight parts dimethylvinylsiloxy-endblocked dimethylsiloxane-methylphenylsiloxane copolymer with a viscosity of 2 Pa.s, a vinyl content of 0.24 weight %, and a phenyl group content constituting 4.5 mole % of the total silicon-bonded organic groups;

(B) 4.0 weight parts trimethylsiloxy-endblocked dimethylsiloxane-methylhydrogensiloxane copolymer with a viscosity of 0.005 Pa.s and a silicon-bonded hydrogen content of 0.7 weight %;

(C) 0.1 weight part 1 weight % isopropanolic chloroplatinic acid solution;

(D) 10.0 weight parts branched-chain dimethylpolysiloxane endblocked by dimethylvinylsiloxy and trimethylsiloxy and having a viscosity of 0.40 Pa.s and a vinyl content of 0.2 weight %; and as optional components, 0.01 weight part addition-reaction inhibitor (3-phenyl-1-butyn-3-ol); 1.0 weight part adhesion promoter consisting of a 1:1 (weight ratio) mixture of 3-glycidoxypropyltrimethoxysilane and dimethylhydroxysiloxy-endblocked methylvinylpolysiloxane with a viscosity of 0.04 Pa.s; and 40 weight parts inorganic filler (silica micropowder with an average particle size of 1.0 μm).

Heating this curable silicone composition at 150° C. for 30 minutes gave a silicone rubber with a JIS A durometer of 42 at room temperature. This silicone rubber had a complex modulus at −65° C. and a 10 Hz shear frequency of $2.7 \times 10^6$ Pa and a Young's modulus at −65° C. of $6.9 \times 10^6$ Pa.

Electronic components as shown in FIG. 1 were fabricated using this curable silicone composition as the adhesive and sealant/filling agent. Table 1 reports the results from the evaluation of the degassing behavior of the curable silicone composition and the thermal shock resistance of the electronic components.

Comparative Example 2

A curable silicone composition with a viscosity of 12 Pa.s was prepared by mixing the following to homogeneity:

(A) 45.0 weight parts dimethylvinylsiloxy-endblocked dimethylpolysiloxane with a viscosity of 2 Pa.s (vinyl content=0.24 weight %) instead of component (A);

(B) 4.0 weight parts trimethylsiloxy-endblocked dimethylsiloxane-methylhydrogensiloxane copolymer with a viscosity of 0.005 Pa.s and a silicon-bonded hydrogen content of 0.7 weight %;

(C) 0.1 weight part 1 weight % isopropanolic chloroplatinic acid solution;

(D) 10.0 weight parts branched-chain dimethylpolysiloxane endblocked by dimethylvinylsiloxy and trimethylsiloxy and having a viscosity of 0.40 Pa.s and a vinyl content of 0.2 weight %; and as optional components, 0.01 weight part addition-reaction inhibitor (3-phenyl-1-butyn-3-ol); 1.0 weight part adhesion promoter consisting of a 1:1 (weight ratio) mixture of 3-glycidoxypropyltrimethoxysilane and dimethylhydroxysiloxy-endblocked methylvinylpolysiloxane with a viscosity of 0.04 Pa.s; and 40 weight parts inorganic filler (silica micropowder with an average particle size of 1.0 μm).

Heating this curable silicone composition at 150° C. for 30 minutes gave a silicone rubber with a JIS A durometer of 42 at room temperature. This silicone rubber had a complex modulus at −65° C. and a 10 Hz shear frequency of $3.8 \times 10^8$ Pa and a Young's modulus at −65° C. of $8.3 \times 10^8$ Pa.

Electronic components as shown in FIG. 1 were fabricated using this curable silicone composition as the adhesive and sealant/filling agent. Table 1 reports the results from the evaluation of the degassing behavior of the curable silicone composition and the thermal shock resistance of the electronic components.

Example 3

Electronic components as shown in FIG. 1 were fabricated using the curable silicone composition prepared in Example 1 as the adhesive and using the curable silicone composition prepared in Comparative Example 1 as the sealant/filling agent. Table 1 reports the results from the evaluation of the thermal shock resistance of the resulting electronic components.

Example 4

Electronic components as shown in FIG. 1 were fabricated using the curable silicone composition prepared in Comparative Example 1 as the adhesive and using the curable silicone composition prepared in Example 1 as the sealant/filling agent. Table 1 reports the results from the evaluation of the thermal shock resistance of the resulting electronic components.

Comparative Example 3

A curable silicone composition with a viscosity of 17 Pa.s was prepared according to the procedure in Example 1, but in this case omitting the 10.0 weight parts dimethylvinylsiloxy-endblocked dimethylpolysiloxane (viscosity=20 Pa.s, vinyl content=0.1 weight %) used as component (D) in the curable silicone composition prepared in Example 1.

Heating this curable silicone composition at 150° C. for 30 minutes gave a silicone rubber with a JIS A durometer of 45 at room temperature. This silicone rubber had a complex modulus at −65° C. and a 10 Hz shear frequency of $1.5 \times 10^6$ Pa and a Young's modulus at −65° C. of $3.4 \times 10^6$ Pa.

Electronic components as shown in FIG. 1 were fabricated using this curable silicone composition as the adhesive and sealant/filling agent. Table 1 reports the results from the evaluation of the degassing behavior of the curable silicone composition and the thermal shock resistance of the electronic components.

Example 5

A curable silicone composition with a viscosity of 14 Pa.s was prepared by mixing the following to homogeneity:

(A) 57.7 weight parts dimethylvinylsiloxy-endblocked dimethylsiloxane-methylphenylsiloxane copolymer with a viscosity of 2 Pa.s, a vinyl content of 0.24 weight %, and a phenyl group content constituting 4.5 mole % of the total silicon-bonded organic groups;

(B) 1.3 weight parts trimethylsiloxy-endblocked dimethylsiloxane-methylhydrogensiloxane copolymer with a viscosity of 0.005 Pa.s and a silicon-bonded hydrogen content of 0.7 weight %;

(C) 0.1 weight part 1 weight % isopropanolic chloroplatinic acid solution;

(D) 0.01 weight part dimethylvinylsiloxy-endblocked dimethylpolysiloxane with a viscosity of 100 Pa.s and a vinyl content of 0.06 weight %; and as optional components, 0.01 weight part addition-reaction inhibitor (3-phenyl-1-butyn-3-ol); 1.0 weight part adhesion promoter consisting of a 1:1 (weight ratio) mixture of 3-glycidoxypropyltrimethoxysilane and dimethylhydroxysiloxy-endblocked methylvinylpolysiloxane with a viscosity of 0.040 Pa.s; and 40 weight parts inorganic filler (silica micropowder with an average particle size of 1.0 µm).

Heating this curable silicone composition at 150° C. for 30 minutes gave a silicone rubber with a JIS A durometer of 22 at room temperature. This silicone rubber had a complex modulus at −65° C. and a 10 Hz shear frequency of $3.0 \times 10^5$ Pa and a Young's modulus at −65° C. of $7.8 \times 10^5$ Pa.

Electronic components as shown in FIG. 1 were fabricated using this curable silicone composition as the adhesive and sealant/filling agent. Table 1 reports the results from the evaluation of the degassing behavior of the curable silicone composition and the thermal shock resistance of the electronic components.

The curable silicone composition according to the present invention is characterized by an excellent degassing behavior prior to cure and by the ability to cure to give cured silicone that has an excellent stress-relaxing capacity at low temperatures. Electronic components according to the present invention are characterized by an excellent thermal shock resistance as a consequence of the use therein of the curable silicone composition according to the present invention.

That which is claimed is:

1. A curable silicone composition, comprising:
(A) 100 parts by weight of an organopolysiloxane containing silicon-bonded aryl groups and at least two alkenyl groups per molecule, and having a viscosity of from 0.01 to 1,000 Pa.s at 25° C., wherein the aryl groups comprise from 1 to 40 mole % of the total silicon-bonded organic groups in the organopolysiloxane;
(B) an organopolysiloxane having a viscosity of from 0.001 to 10 Pa.s at 25° C. and containing at least 2 silicon-bonded hydrogen atoms per molecule, in a quantity sufficient to cure the composition;
(C) a platinum catalyst in a quantity sufficient to cure the composition; and
(D) 0.00001 to 100 parts by weight of an organopolysiloxane having a viscosity of from 0.01 to 10,000 Pa.s at 25° C., with the proviso that when the organopolysiloxane contains aryl groups, the aryl groups comprise less than 1 mole % or more than 40 mole % of the total silicon-bonded organic groups in the organopolysiloxane, and wherein the organopolysiloxane cures to form a silicone having a complex modulus $\leq 1 \times 10^8$ Pa at −65° C. and a shear frequency of 10 Hz or a cured silicone having a Young's modulus $\leq 2.9 \times 10^8$ Pa at −65° C.

2. The composition according to claim 1, wherein the aryl groups in component (A) comprise from 1 to 25 mole % of the total silicon-bonded organic groups in the organopolysiloxane.

3. The composition according to claim 1, wherein component (A) has a straight-chain molecular structure.

4. The composition according to claim 1, wherein the quantity of component (B) is sufficient to provide from 0.3 to 10 moles of silicon-bonded hydrogen atoms per 1 mole of total alkenyl groups in components (A) and (D).

TABLE 1

|  | present invention | | | | | comparative examples | | |
|---|---|---|---|---|---|---|---|---|
|  | | | | | | Comp. | Comp. | Comp. |
|  | Example 1 | Example 2 | Example 3 | Example 4 | Example 5 | Example 1 | Example 2 | Example 3 |
| degassing behavior of the curable silicone composition | good | good | good | good | good | good | good | poor |
| degassing behavior of the curable silicone composition during electronic component fabrication | good | good | good | good | good | good | good | poor |
| thermal shock resistance of the electronic components defect % | | | | | | | | |
| after 1000 cycles | 0 | 0 | 0 | 0 | 0 | 20 | 20 | 5 |
| after 3000 cycles | 0 | 0 | 5 | 5 | 0 | 30 | 30 | 10 |

5. The composition according to claim 1, wherein component (D) contains at least 2 alkenyl groups per molecule.

6. The composition according to claim 1, wherein component (D) has a molecular structure selected from the group consisting of straight-chain and branched-chain.

7. The composition according to claim 1, wherein the amount of component (D) is from 0.0001 to 50 parts by weight per 100 parts by weight of component (A).

8. The composition according to claim 1, further comprising an addition-reaction inhibitor.

9. The composition according to claim 1, further comprising an adhesion promoter.

10. The composition according to claim 9, wherein the adhesion promoter comprises a mixture of 3-glycidoxypropyltrimethoxysilane and a dimethylhydroxysiloxy-endbolcked methylvinylpolysiloxane having a viscosity of about 0.040 Pa.s.

11. The composition according to claim 1, further comprising an inorganic filler.

12. The composition according to claim 11, wherein the organic filler is a silica.

13. An electronic component, comprising: a semiconductor chip, a semiconductor chip attachment element bonded by an adhesive to the semiconductor chip, at least one member that electrically connects the semiconductor chip with the semiconductor chip attachment element, wherein at least a portion of the member is sealed or imbedded with a sealant/filling agent, and at least one of the adhesive and the sealant/filling agent is the curable silicone composition of claim 1.

14. The electronic component according to claim 13, wherein the component is an integrated circuit, a large-scale integrated circuit, or a very large-scale integrated circuit.

15. The electronic component according to claim 13, wherein the semiconductor chip attachment element is a ceramic, an organic resin, or a metal.

16. The electronic component according to claim 13, wherein the member that electrically connects the semiconductor chip with the semiconductor chip attachment element is a bonding wire, a lead, or a bump.

17. The electronic component according to claim 16, wherein the bonding wire and lead are curved, bent, or flexed and wherein the bump is made of a material having a low Young's modulus.

18. The electronic component according to claim 13, wherein both the adhesive and the sealant/filling agent are the curable silicone composition of claim 1.

19. A process for fabricating an electronic component, comprising:
 (i) attaching a semiconductor chip to a semiconductor chip attachment element with an adhesive composition;
 (ii) curing the adhesive composition;
 (iii) electrically connecting the semiconductor chip by a member with the semiconductor chip attachment element;
 (iv) sealing at least a portion of the member that electrically connects the semiconductor chip with the semiconductor chip attachment element with a sealant/filling agent; and
 (v) curing the sealant/filling agent; wherein at least one of the adhesive and the sealant/filling agent is the curable silicone composition of claim 1.

20. The process according to claim 19, wherein step (iii) is performed before step (ii).

21. The process according to claim 19, wherein both the adhesive and the sealing/filling agent are the curable silicone composition of claim 1.

22. The process according to claim 19, wherein the member that electrically connects the semiconductor chip with the semiconductor chip attachment element is sealed by heating the curable silicone composition.

23. The process according to claim 19, wherein the adhesive is bonded to or in intimate contact with the sealant/filling agent in the electronic component.

24. The process according to claim 19, wherein the sealant/filling agent is bonded to or in intimate contact with the member that electrically connects the semiconductor chip with the semiconductor chip attachment element.

* * * * *